US010347738B1

(12) United States Patent
Ramu et al.

(10) Patent No.: US 10,347,738 B1
(45) Date of Patent: Jul. 9, 2019

(54) FABRICATION OF A DUAL-OPERATION DEPLETION/ENHANCEMENT MODE HIGH ELECTRON MOBILITY TRANSISTOR

(71) Applicant: Duet Microelectronics LLC, Raritan, NJ (US)

(72) Inventors: Ashok T. Ramu, Raritan, NJ (US); Keun-Yong Ban, Raritan, NJ (US); John Bayruns, Raritan, NJ (US); Robert J. Bayruns, Raritan, NJ (US)

(73) Assignee: Duet Microelectronics, Inc., Raritan, NJ (US)

( * ) Notice: Subject to any disclaimer, the term of this patent is extended or adjusted under 35 U.S.C. 154(b) by 0 days.

(21) Appl. No.: 15/979,988

(22) Filed: May 15, 2018

Related U.S. Application Data

(63) Continuation-in-part of application No. 15/958,579, filed on Apr. 20, 2018.

(51) Int. Cl.
*H01L 31/072* (2012.01)
*H01L 31/109* (2006.01)
*H01L 29/66* (2006.01)
*H01L 29/778* (2006.01)
*H01L 21/02* (2006.01)
*H01L 21/764* (2006.01)
*H01L 21/425* (2006.01)

(52) U.S. Cl.
CPC .... *H01L 29/66431* (2013.01); *H01L 21/0257* (2013.01); *H01L 21/425* (2013.01); *H01L 21/764* (2013.01); *H01L 29/7786* (2013.01)

(58) Field of Classification Search
USPC ........................................................ 257/194
See application file for complete search history.

(56) References Cited

U.S. PATENT DOCUMENTS 7,968,391 B1 * 6/2011 Smart ................. H01L 29/7787
257/194
9,147,632 B2 * 9/2015 Ritenour ................. H01L 23/34

OTHER PUBLICATIONS

Boroumand et al., "Observations of Backgate Impedance Dispersion in GaAs Isolation Structures", IEEE Transactions on Electron Devices, vol. 48, No. 9, Sep. 2011, pp. 1850-1858.
Kocot et al., "Backgating in GaAs MESFET's", IEEE Transactions on Microwave Theory and Techniques, vol. MTT-30, No. 7, Jul. 1982, pp. 963-968.

(Continued)

*Primary Examiner* — Theresa T Doan
(74) *Attorney, Agent, or Firm* — John H. Choi & Associates

(57) ABSTRACT

Fabrication of a dual enhancement-mode/depletion-mode (E-Mode/D-Mode) high electron mobility transistor (HEMT) called a threshold control terminal HEMT (TCT-HEMT) is performed which reduces capacitance between the TCT electrode and the source and drain electrodes of a TCT-HEMT, since such a capacitance may be parasitic, and which fabricates a TCT-HEMT capable of high-frequency operation. A method for fabricating a field-effect transistor (FET) includes: providing a substrate; disposing a back barrier on the substrate to form a base stack; forming a doped layer on the base stack; grow additional layers, including a threshold-control terminal (TCT) access layer; etch a pattern in at least one of the doped layer and the additional layers; and disposing a TCT contact on the TCT access layer.

18 Claims, 17 Drawing Sheets

(56) References Cited

OTHER PUBLICATIONS

Chen et al., "Reduction of Sidegating in GaAs Analog and Digital Circuits Using a New Buffer Layer", IEEE Transactions on Electron Devices, vol. 36, No. 9, Sep. 1989, pp. 1546-1556.

Kawaharazuka et al., Study of Free GaAs Surfaces Using a Backgated Undoped GaAs/AlGaAs Heterostructure, Physica E, vol. 13, 2002, pp. 663-666.

Norman Fadhil Idham et al., "Device Characteristics of HEMT Structures Based on Backgate Contact Method", ICSE2006 Proc. 2006, pp. 740-742.

Bayruns et al., "The Bootstrapped Gate FET (BGFET)—A New Control Transistor", GaAs IC Symposium, 1995, pp. 136-139.

Abey et al., "A Single Supply High Performance PA MMIC for GSM Handsets using Quasi-Enhancement Mode PHEMT", IEEE MTT-S Digest, 2001, pp. 923-926.

Lin et al., "A Delta-Doped InGaP/InGaAs PHEMT with Different Doping Profiles for Device-Linearity Improvement", IEEE Transactions on Electron Devices, vol. 54, No. 7, Jul. 2007, pp. 1617-1625.

\* cited by examiner

FABRICATION OF A DUAL-OPERATION DEPLETION/ENHANCEMENT MODE HIGH ELECTRON MOBILITY TRANSISTOR

CROSS-REFERENCE TO RELATED APPLICATION

This application is a continuation-in-part of U.S. application Ser. No. 15/958,579, filed on Apr. 20, 2018, which is incorporated by reference in its entirety.

FIELD

The present disclosure relates to transistors and in particular to a dual-operation depletion/enhancement mode high electron mobility transistor.

BACKGROUND

Field-effect transistors (FETs), that exemplify solid-state electronic transistors, are three-terminal devices that operate based on the field effect. Referring to FIG. 1A, when operating a FET 10, a voltage applied to a terminal 12 called the "Gate Electrode" acts on mobile charge carriers remotely through a front barrier 14 which may be insulating, weakly conducting, or semiconducting. The mobile charge carriers get pulled into/depleted from a "channel" region 16, by means of electrostatic fields.

The gate electrode 12 may form or disrupt a conductive "bridge" in the channel region 16 between two other terminals 18, 20 called the "Source Electrode" and the "Drain Electrode", respectively, depending on: (a) the voltage magnitude and voltage polarity applied externally to the gate electrode 12; (b) the polarity of charge being pulled into, or depleted from, the channel 16 by the gate 12 (negative for electrons, positive for electron vacancies also known as "holes"); and (c) the polarity and quantity of immobile fixed charges either present in the channel 16 or in the front barrier 14. Other structures of the FET 10 may include a conducting cap 22 disposed on the front barrier 14, which in turn is disposed on the channel 16. The channel 16 may be disposed on a back barrier 24, which in turn is disposed on a substrate 26. A pulse doping layer 28 may be disposed within the front barrier 14, with the pulse doping layer 28 being, for example, an n++ or donor of electrons traveling from the source 18 to the drain 20.

For clarity of exposition, as described herein, an arrangement where a "HIGH" voltage applied to the gate terminal 12 attracts negatively charged electrons into an otherwise weakly conducting channel 16, thereby forming a conducting path that electrically bridges the electron-rich source 18 and drain 20. On the other hand, application of a "LOW" gate voltage would then disrupt the conducting path, thus electrically isolating the source 18 and drain 20. This is called an n-channel FET, meaning that the carriers of electric current are negatively charged electrons.

FETs are classified as depletion-mode ("D-Mode") or enhancement-mode ("E-Mode") transistors based on the maximum value of the "LOW" voltage beyond which appreciable conduction occurs. If the device starts conducting at a "LOW" voltage which is negative, it is called a D-Mode FET. If it takes a positive "LOW" voltage for the device to start conducting, so that there is no appreciable current when the gate is at 0 Volt, it is called an E-Mode FET.

A high-electron mobility transistor (HEMT) in the prior art is illustrated in FIG. 1A, which is a FET in which the front barrier 14 is a semiconductor as well, usually an alloy different in elemental composition from the material of the channel 14. With a semiconducting front barrier 14, it is easier in practice to insert fixed electrical charges that would further modulate the response of electrons in the channel 16 to the gate voltage. A variant of the basic HEMT structure in the prior art, shown as the FET 30 in FIG. 2, features two delta-doped layers 32, 34, one in each barrier 36, 38, respectively, such as described in Lin et al., "A Delta-Doped InGaP/InGaAs PHEMT with Different Doping Profiles for Device-Linearity Improvement", IEEE TRANSACTIONS ON ELECTRON DEVICES, Vol. 54, No. 7, July 2007, pp. 1617-1625.

The operation of the FET is best visualized by means of a partial "band energy diagram", which is the energy of the edge of the conduction band (CB) pictured as a function of spatial position. The band energy diagrams, such as shown in FIG. 1D, are constructed such that, under the prevalent electrostatic fields, electrons tend to pool near the bottom of the profile. The dashed lines show the "chemical potential" (also known as Fermi level) which may be considered an energy reference for the CB. It is important to note that the lower the CB energy relative to this reference at any point, the larger the electron concentration at that point.

FIG. 1D shows the band energy diagram in a vertical section through the center of FIG. 1A, cutting through the gate metal, front barrier, channel, back barrier and substrate. The barriers are made of a semiconductor of a different material or alloy composition than the channel. An example plot of material elemental composition vs. vertical location is illustrated in FIG. 1E. As shown in FIG. 1D, with such a material stack, a conduction band "well" forms at the barrier-channel interface, where electrons can be made to pool by increasing the gate voltage, as explained below. This pool of electrons, once created by applying a large enough gate voltage, would bridge the source and drain terminals and allow an electrical current.

FIGS. 1B-1C show schematically the CB energy as a function of position in the channel, across the device of FIG. 1A from source to drain terminals. If the gate voltage is very low, the CB energy in the channel under the gate electrode is high, presenting a potential step that blocks electrons from transferring from source to drain, even if the drain CB energy is lower than that of the source. As the gate voltage increases, the step height decreases, until a threshold gate voltage is reached. At this threshold voltage (also known as "pinch-off voltage"), electrons in the source can gain enough energy from random thermal excitations to overcome the step, as shown in FIG. 1C, after which they are accelerated by the drain voltage into the drain terminal, providing current at the drain terminal.

FIGS. 3A-3B display exemplary plots of the drain current $I_D$ versus the gate-to-source voltage $V_{Gs}$. The source is chosen to be the zero of potential throughout the present disclosure. A fixed positive voltage is applied to the drain to collect the electrons launched from the source. This drain voltage is often close to the highest DC voltage in the system, such as the positive power supply rail. As described herein, a threshold voltage is present during which the drain current is small, followed by an abrupt increase as the potential step becomes low enough to be surmounted by electrons thermally excited from the source. Beyond this point, the current at the drain monotonically increases as the increasing gate voltage attracts more and more electrons into the channel. FIG. 3A represents a D-Mode FET, since the threshold voltage for conduction to begin is negative, while FIG. 3B represents an E-Mode FET, since the threshold voltage is positive.

In the prior art, the influence of FET electrical characteristics by another terminal, different from the source, drain, and gate, has long been investigated as a nuisance effect. The other terminal, as a "fourth terminal", considered in the prior art typically belongs to a different device on the same chip, causing nominally isolated devices on the same chip to become electrically coupled. This coupling is through (a) direct current injection by the fourth terminal, (b) indirect modulation of the channel potential through charging or discharging interface traps beneath the channel, or (c) direct electrostatic modulation of the channel potential. Such unwanted coupling to a fourth terminal has been labelled "back-gating" or "side-gating" in the prior art, such as in Boroumand et al., "Observations of Backgate Impedance Dispersion in GaAs Isolation Structures", IEEE TRANSACTIONS ON ELECTRON DEVICES, Vol. 48, No. 9, September 2011, pp. 1850-1858; Kocot et al., "Backgating in GaAs MESFET's", IEEE TRANSACTIONS ON MICROWAVE THEORY AND TECHNIQUES, Vol. MTT-30, No. 7, July 1982, pp. 963-968; and Chen et al., "Reduction of Sidegating in GaAs Analog and Digital Circuits Using a New Buffer Layer", IEEE TRANSACTIONS ON ELECTRON DEVICES, Vol. 36, No. 9, September 1989, pp. 1546-1556. Effect (c) has been neglected in such studies since typical inter-device separations are on the order of tens of microns. Occasionally, a substrate contact is termed the "back-gate", as described in the prior art in Norman Fadhil Idham et al., "Device Characteristics of HEMT Structures Based on Backgate Contact Method", ICSE2006 Proc. 2006, pp. 740-742; but its large distance from the channel, on the order of hundreds of microns, and its isolation due to the highly resistive substrate makes the substrate contact unusable for purposes of threshold voltage control.

An underlying n-doped (donor-doped) layer has been utilized as an investigative tool to examine charge-potential characteristics of free GaAs surfaces, as described in the prior art such as Kawaharazuka et al., "Study of Free GaAs Surfaces Using a Back-gated Undoped GaAs/AlGaAs Heterostructure, PHYSICA E, Vol. 13, 2002, pp. 663-666. The Kawaharazuka reference (a) describes essentially a 3-terminal device viewed upside-down, and (b) serves a different purpose to that in the present inventive disclosure. Additionally, it is to be noted that n-doped layers, if attempted to be used as threshold-control terminal (TCT) access layers, are incompatible with dual E/D-Mode operation with a single power supply. This is because E-mode operation in such a hypothetical device would need a negative voltage applied to the n-doped layer.

A highly resistive p-doped layer underneath the channel has been reported in a MESFET device, such as described in Bayruns et al., "The Bootstrapped Gate FET (BGFET)—A New Control Transistor", GaAs IC Symposium, 1995, pp. 136-139. Its purpose was to improve the linearity of the FET current-voltage characteristics under high-frequency operation. The high resistivity required of the p-doped layer for realizing such a linear FET would make for a poorly controlled threshold voltage in the the present inventive disclosure.

Earlier attempts at single power-supply FET operation have utilized quasi-enhancement mode FETs. These have a slightly positive threshold voltage, so that the current drawn when nominally off; i.e. the gate voltage is 0 volts, is smaller than when nominally on, but not negligible. Special additional circuitry is required to prevent off-state power dissipation, as described in the prior art in Abey et al., "A Single Supply High Performance PA MMIC for GSM Handsets using Quasi-Enhancement Mode PHEMT", IEEE MTT-S Digest, 2001, pp. 923-926.

SUMMARY

The following presents a simplified summary of some embodiments of the invention in order to provide a basic understanding of the invention. This summary is not an extensive overview of the invention. It is not intended to identify key/critical elements of the invention or to delineate the scope of the invention. Its sole purpose is to present some embodiments of the invention in a simplified form as a prelude to the more detailed description that is presented later.

The present invention is a FET having a p-doped (acceptor-doped) layer underneath a FET channel to enable E/D Mode operation. A FET threshold voltage is tunable through a voltage applied to the p-doped layer via a metal contact such as a threshold-control terminal (TCT). The present invention has a dual E/D mode operation of a single FET device, and also a dual E/D mode operation with a single-polarity positive power supply voltage.

The FET of the present invention is fabricated to enable dual enhancement-mode/depletion-mode (E-Mode/D-Mode) high electron mobility transistors (HEMTs), to enable dual E/D Mode operation by incorporating a p-doped (acceptor doped) region underneath the channel, to achieve tunable threshold voltage by varying the bias voltage on a fourth terminal called the threshold-control terminal (TCT) that contacts the p-doped layer, and to enable Dual E/D-Mode operation of a HEMT with a single-polarity positive power supply voltage.

In one embodiment, the present invention includes a field-effect transistor (FET) comprising: a substrate; a back barrier disposed on the substrate; a middle barrier disposed above the back barrier, wherein at least one pulse-doping layer is disposed within the middle barrier; a channel disposed on the middle barrier; and a front barrier disposed on the channel. A threshold-control terminal (TCT) access layer is disposed between the middle barrier and the back barrier, wherein a voltage applied to the TCT access layer tunes a threshold voltage of the FET. A front hole-blocker layer is disposed between the middle barrier and the TCT access layer. A spacer layer is disposed between the middle barrier and the TCT access layer. A back hole-blocker layer is disposed between the back barrier and the TCT access layer. A spacer layer is disposed between the back barrier and the TCT access layer. The front barrier includes at least one pulse-doping layer disposed therein. A substrate contact is included upon which the substrate is disposed.

In an alternative embodiment, an n-doped threshold-control terminal (TCT) access layer is disposed between the middle barrier and the back barrier, wherein a voltage applied to the TCT access layer tunes the threshold voltage of the FET. The carriers of electrical current in the FET channel are electron-holes.

In another embodiment, the channel is doped, which acts as a bridge between the source and the drain. A source terminal and a drain terminal are included, wherein the bridge is disrupted by "depleting" the channel through the application of a voltage opposite in polarity to that of the ionized impurities functioning as the dopants of the doped channel. The FET is selected from a hetero-junction FET (HFET), a junction gate FET (JFET), and a metal-semiconductor FET (MESFET).

In another embodiment, a p-doped threshold-control terminal (TCT) access layer, a spacer layer, and a hole-blocking layer are included, wherein at least one of the p-doped TCT access layer, the spacer layer, the hole-blocking layer, the channel, the front barrier, the middle barrier, and the back barrier is composed of a compound selected from (In)GaAs, (In)GaP, (Ga)AlAs, (Al)InAs, (In)GaN or (Ga)AlN. The substrate is composed of a compound selected from GaAs, InP, GaN, Si, SiC or Al2O3.

In an alternative embodiment, the present invention includes a field-effect transistor (FET) comprising: a substrate; a back barrier disposed on the substrate; a threshold-control terminal (TCT) access layer disposed above the back barrier, wherein a voltage applied to the TCT access layer tunes a threshold voltage of the FET; a middle barrier disposed above the TCT access layer, wherein at least one pulse-doping layer is disposed within the middle barrier; a channel disposed on the middle barrier; a front barrier disposed on the channel; and a gate disposed on the front barrier. The TCT access layer is p-doped. A TCT contact is disposed on the TCT access layer.

In another alternative embodiment, the present invention includes a method for fabricating a field-effect transistor (FET) comprising: providing a substrate; disposing a back barrier on the substrate; disposing a threshold-control terminal (TCT) access layer above the back barrier; disposing a middle barrier above the TCT access layer; disposing at least one pulse-doping layer within the middle barrier; disposing a channel on the middle barrier; disposing a front barrier on the channel; and applying a voltage to the TCT access layer, thereby tuning a threshold voltage of the FET.

In further alternative embodiments, the present invention enables fabrication of a dual enhancement-mode/depletion-mode (E-Mode/D-Mode) high electron mobility transistor (HEMT) called a threshold control terminal HEMT (TCT-HEMT); reduces capacitance between the TCT electrode and the source and drain electrodes of a TCT-HEMT, since such a capacitance may be parasitic; and fabricates a TCT-HEMT capable of high-frequency operation.

In the alternative embodiments, the present invention includes a method for fabricating a field-effect transistor (FET) comprising: providing a substrate; disposing a back barrier on the substrate to form a base stack; forming a doped layer on the base stack; grow additional layers, including a threshold-control terminal (TCT) access layer; etch a pattern in at least one of the doped layer and the additional layers; and disposing a TCT contact on the TCT access layer. The forming of the doped layer includes depositing the doped layer on the base stack. Alternatively, the forming of the doped layer includes forming a doped semiconducting layer from an undoped semiconductor layer, which includes performing ion implantation on the undoped semiconductor layer.

The growing of additional layers includes laterally etching the doped layer to form an air gap between at least two of the additional layers. Alternatively, the growing of additional layers includes laterally oxidizing at least one of the additional layers to form an oxidized layer. The laterally oxidizing includes applying steam to the at least one additional layer. Alternatively, the growing of additional layers includes performing area-selective regrowth to at least one of the additional layers, such as by depositing an unintentionally-doped (UID) layer on the base stack; applying a regrowth mask to the UID layer; and growing a doped semiconductor layer substantially to the height of a surface of the UID layer. The growing of the doped semiconductor layer is epitaxial. The applying of a regrowth mask includes selectively depositing a masking layer by plasma-enhanced chemical vapor deposition (PECVD), and the masking layer is composed of $SiO_2$.

Alternatively, the growing of the additional layers includes growing a first additional layer on the base layer; and growing an unintentionally-doped (UID) layer on a surface of the doped layer and on a surface of the base stack. Still further, the growing of the additional layers includes growing an unintentionally-doped (UID) layer on a surface of the base stack, and the UID layer is grown substantially uniformly and substantially planarly on the base stack. Moreover, the growing of additional layers includes encasing a portion of the TCT access layer within an insulating layer or within an unintentionally-doped (UID) layer.

In another alternative embodiment, the present invention includes a method for fabricating a field-effect transistor (FET) includes providing a substrate; disposing a back barrier on the substrate to form a base stack; forming a doped layer on the base stack; etch a pattern in the doped layer; grow an unintentionally-doped (UID) layer; grow an additional layer, including a threshold-control terminal (TCT) access layer; and disposing a TCT contact on the TCT access layer.

In a further alternative embodiment, the present invention includes a field-effect transistor (FET) including: a substrate; a back barrier disposed on the substrate to form a base stack; a doped layer disposed on the base stack; additional layers, including a threshold-control terminal (TCT) access layer, disposed on the doped layer; a pattern etched in at least one of the doped layer and the additional layers; and a TCT contact on the TCT access layer. The at least one of the additional layers is selected from the group consisting of at least a pair of layers forming an air gap therebetween; an oxidized layer; an unintentionally-doped (UID) layer; and an encased layer having an exposed portion.

BRIEF DESCRIPTION OF DRAWINGS

The foregoing summary, as well as the following detailed description of presently preferred embodiments of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In addition, some of the figures are provided further details including exemplary dimensions which are in units of inches.

In the drawings.

Figure 1A:
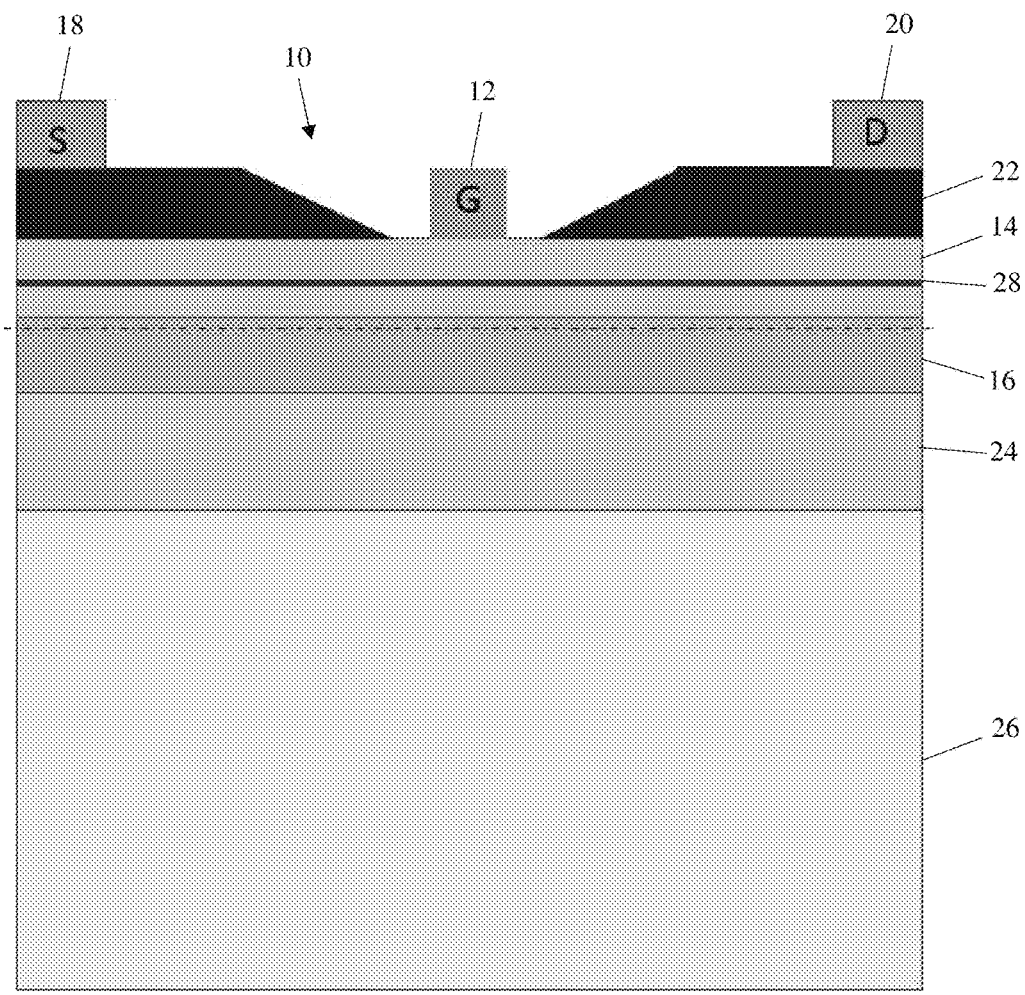
FIG. 1A illustrates a FET in the prior art.
Figure 1B:
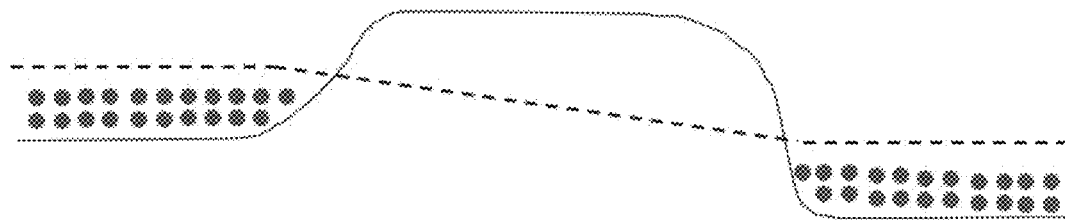
FIGS. 1B-1C illustrate conduction band profiles across the FET of FIG. 1A.
Figure 1C:
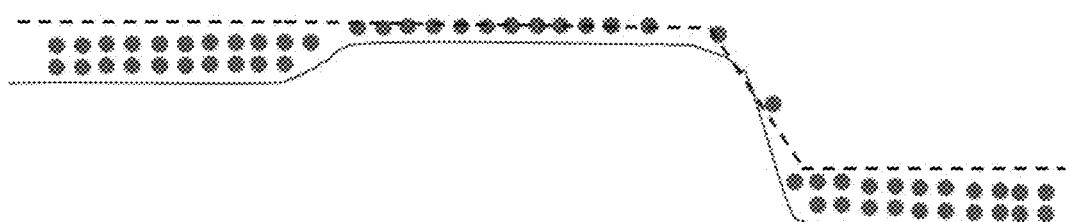
Figure 1D:
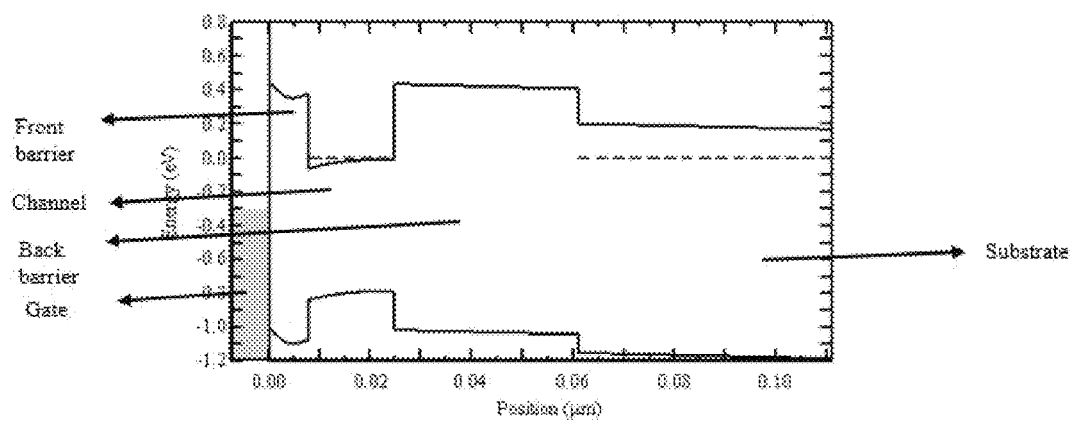
FIG. 1D illustrates a conduction band profile through the center of the FET of FIG. 1A.
Figure 1E:
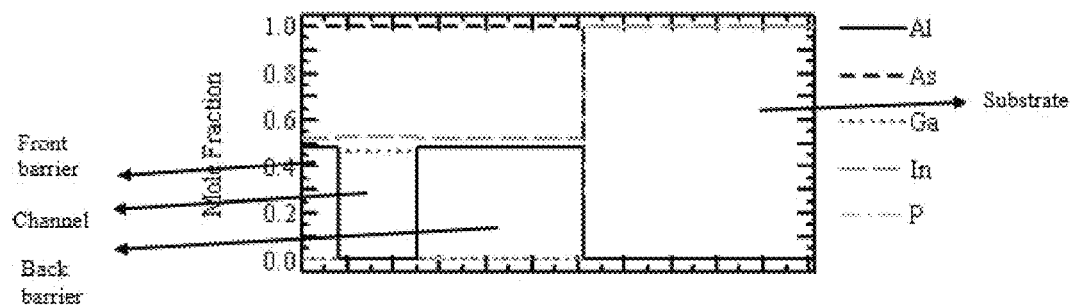
FIG. 1E illustrates a material composition profile through the center of the FET of FIG. 1A.
Figure 2:
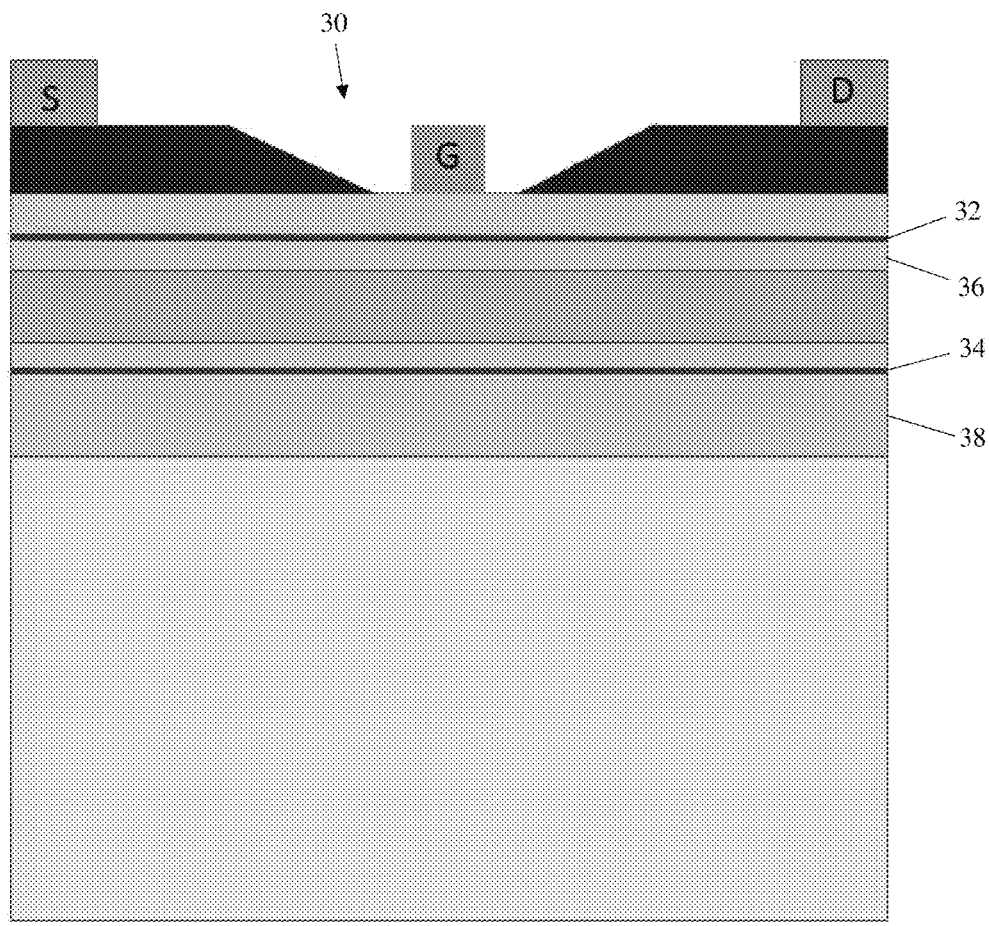
FIG. 2 illustrates a FET with front and back barriers with pulse doping.
Figure 3A:
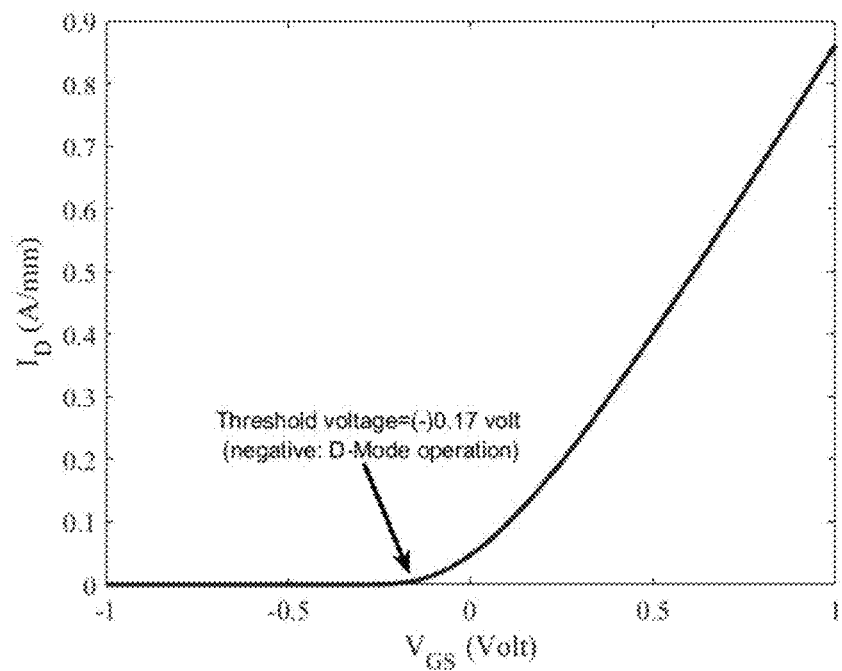
FIG. 3A illustrates an $I_D$ vs. $V_{GS}$ chart for a depletion-mode HEMT.
Figure 3B:
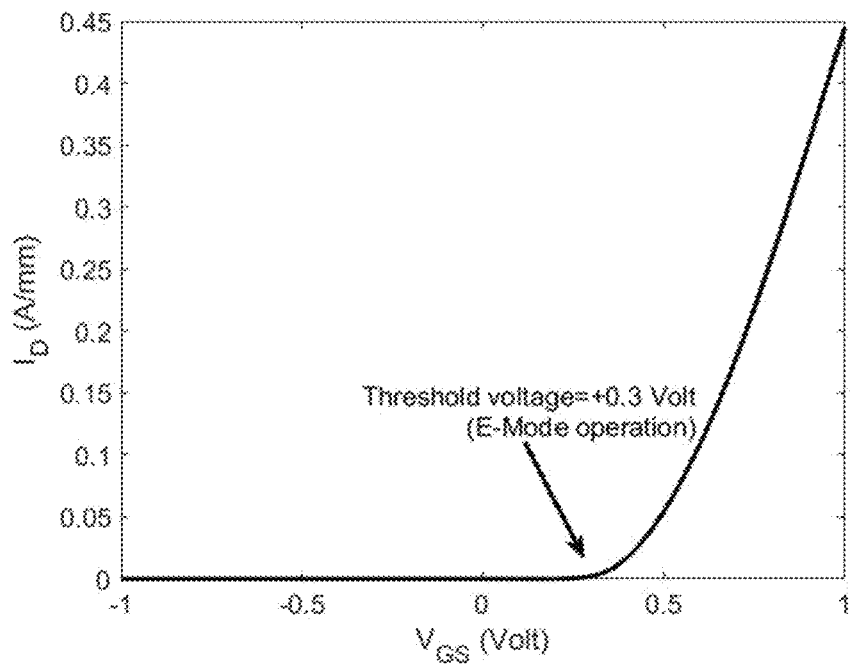
FIG. 3B illustrates an $I_D$ vs. $V_{GS}$ chart for an enhancement-mode HEMT.

To facilitate an understanding of the invention, identical reference numerals have been used, when appropriate, to designate the same or similar elements that are common to the figures. Further, unless stated otherwise, the features shown in the figures are not drawn to scale, but are shown for illustrative purposes only.

DETAILED DESCRIPTION

Certain terminology is used in the following description for convenience only and is not limiting. The article "a" is intended to include one or more items, and where only one item is intended the term "one" or similar language is used. Additionally, to assist in the description of the present invention, words such as top, bottom, side, upper, lower, front, rear, inner, outer, right and left are used to describe the accompanying figures. The terminology includes the words above specifically mentioned, derivatives thereof, and words of similar import.

Figure 4:
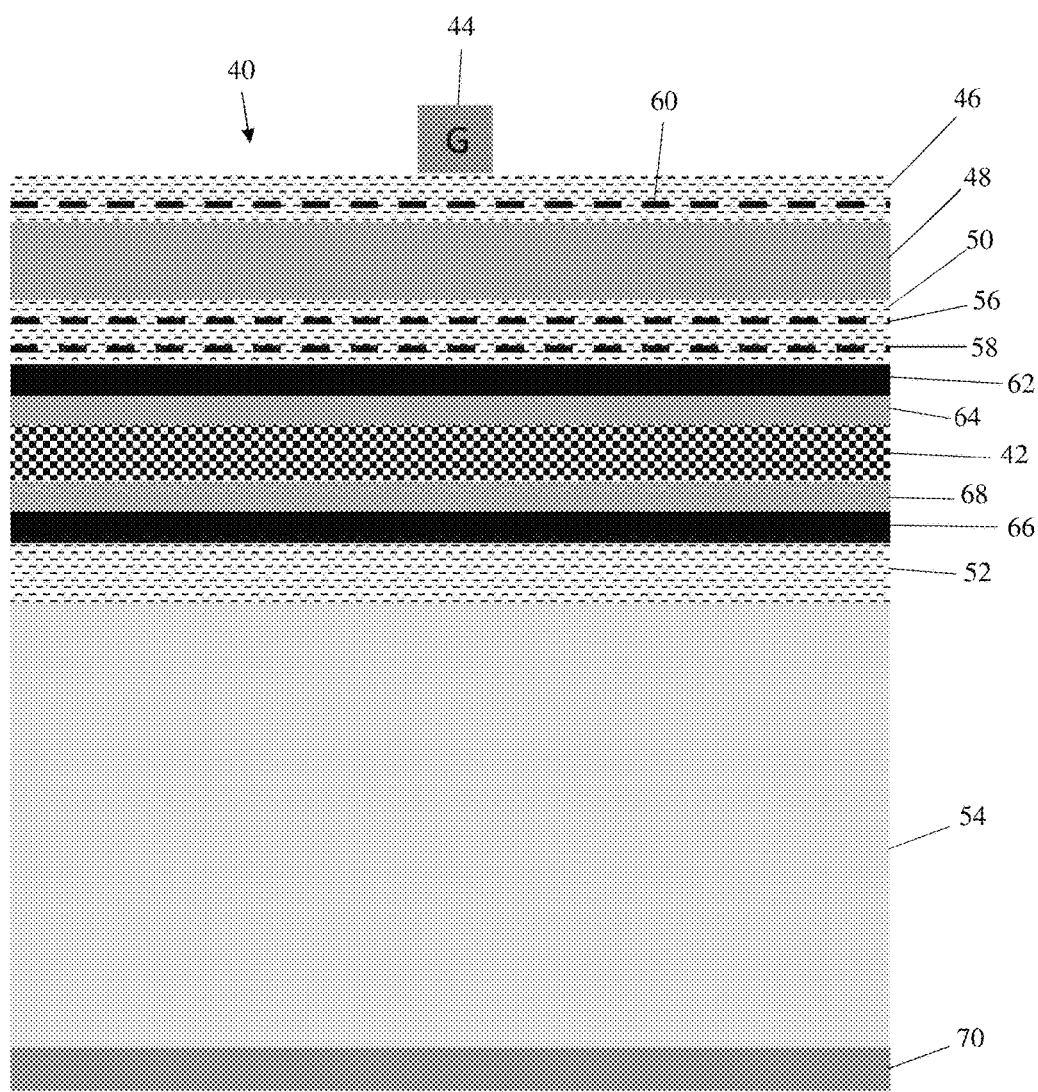
FIG. 4 illustrates an FET of the present invention having a middle barrier.

As illustrated in FIG. 4, the present invention is a HEMT 40 with a TCT-contacting p-doped layer 42. Referring to FIG. 4, a gate 44 is disposed on a front barrier 46, which in turn is disposed on a channel 48. The channel 48 is disposed on a middle barrier 50, which is disposed on the p-doped layer 42. The p-doped layer 42 is disposed on a back barrier 52, which in turn is disposed on a substrate 54. The middle barrier 50 includes at least one pulse doping layer 56, 58. The front barrier 46 may optionally include a pulse doping layer 60. An optional front hole-blocker 62 and/or an optional first undoped spacer 64 may be included between the middle barrier 50 and the TCT-contacting p-doped layer 42. Similarly, an optional back hole-blocker 66 and/or an optional second undoped spacer 68 may be included between the TCT-contacting p-doped layer 42 and the back barrier 52. In addition, a substrate contact 70 may optionally be included under the substrate 54.

In an alternative embodiment, the back barrier 52 may optionally be pulse-doped, which will further reduce hole injection into the substrate 54. If the TCT-access layer 42 is p-doped, then the pulse-doped back barrier 52 is n-doped. Alternatively, if the TCT-access layer 42 is n-doped, then the pulse-doped back barrier 52 is p-doped.

In an example embodiment, the front barrier 46 is composed of AlGaAs, the channel 48 is composed of (In)GaAs, the middle barrier 50 is composed of AlGaAs, the optional front hole-blocker 62 is composed of AlAs, the optional first undoped spacer 64 is composed of (In)GaAs, the TCT-access p-doped layer 42 is also composed of (In)GaAs, the optional second spacer 68 is also composed of (In)GaAs, the optional back hole-blocker 66 is composed of AlAs, the back barrier 52 is composed of AlGaAs, and the substrate 54 is composed of GaAs. However, other alternative embodiments may use different materials, instead of (In)(Al)GaAs layers on GaAs substrates as described herein. The FETs of the present invention do not depend on any special properties of (In)(Al)GaAs not present in other compound semiconductors or alloys, nor on any specific properties of GaAs as a substrate.

Figure 6A:
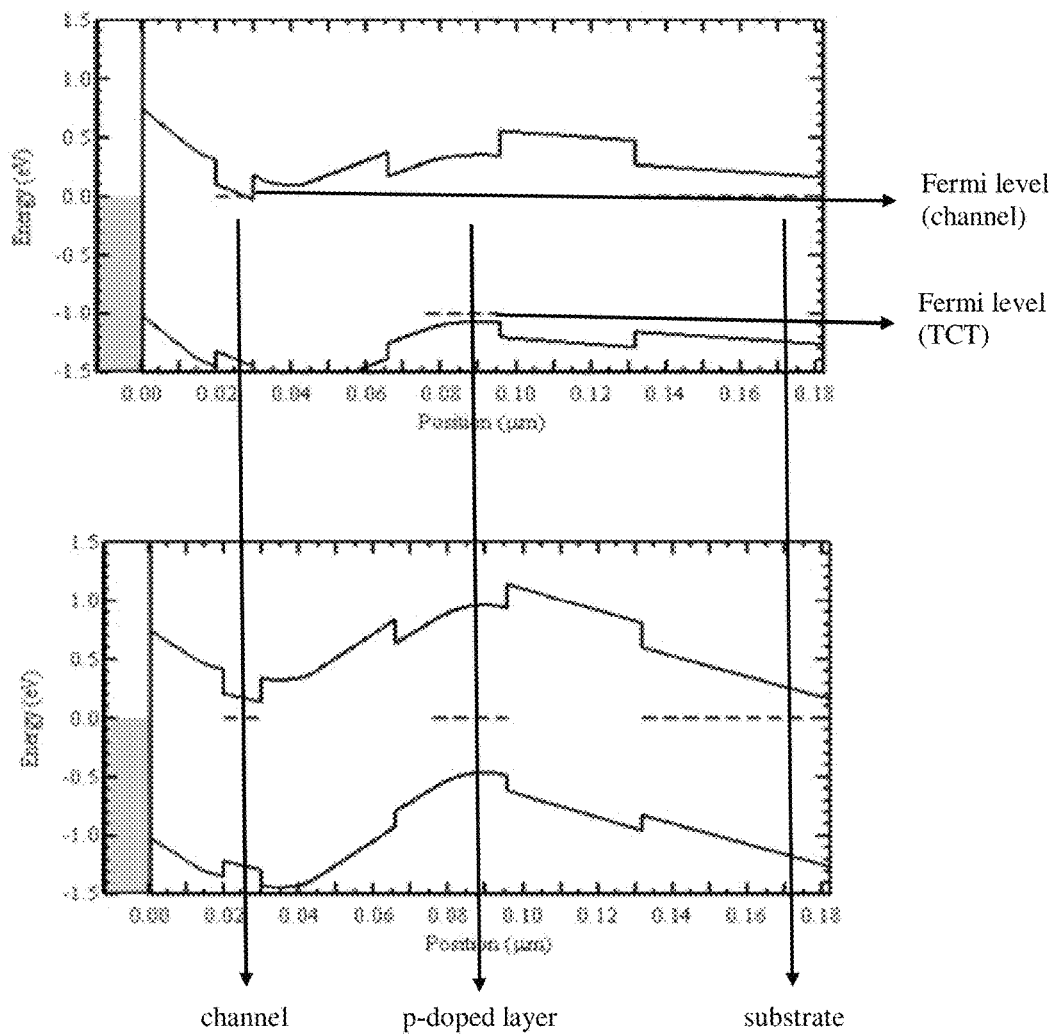
FIG. 6A illustrates an energy band diagram of the FET of FIG. 4.

FIG. 6A shows the conduction band energy diagram with 1 volt on the TCT in the top diagram, and 0 volt on the TCT in the bottom diagram for the HEMT 40 in FIG. 4. In both cases in FIG. 6A, the channel 48 is kept at 0 volt. In many cases, the p-doped layer 42 would be between about 20 nm and about 2 microns in thickness, and is disposed on the substrate 54. With 0 volt on the TCT, it is seen that the p-doped layer 42 (which is depleted of holes resulting in a net fixed, immobile negative charge) pulls the conduction band in the channel up and away from the Fermi level of the TCT, as in the bottom diagram in FIG. 6A. This causes the electron concentration in the channel to fall too low for the channel 48 to serve as a conductive path from source to drain. It can also be thought of as the immobile negative charges repelling electrons away from the channel 48. Thus with 0 volt on the TCT, applying zero volts on the gate, turns the device "OFF"; in other words, the FET 40 operates in E-Mode.

Referring again to FIG. 6A, with 1 volt on the TCT, the p-doped layer 42 gets less depleted of holes, resulting in too few negative immobile charges to sustain sufficient repulsion of channel electrons. In the alternative "band diagram" view in the top diagram of FIG. 6A, the conduction band-edge in the channel 48 gets pulled down towards and below the Fermi level. This causes the electron concentration in the channel 48 to increase, thus enabling the channel 48 to serve as a conductive path from source to drain. Thus with 1 volt on the TCT, just 0 volt on the gate is enough to turn the device "ON"; in other words, the FET 40 operates in D-Mode.

Figure 6B:
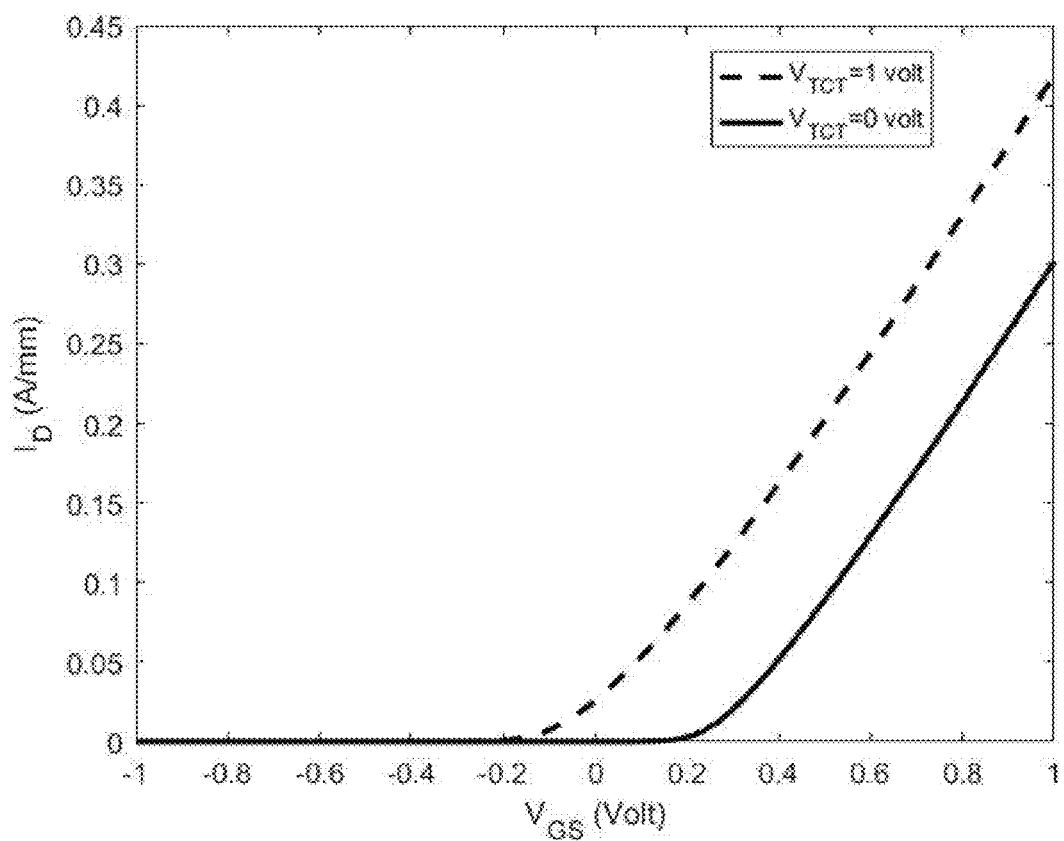
FIG. 6B illustrates a chart of a dual D/E-Mode operation of the FET of FIG. 4.

FIG. 6B shows the $I_D$ vs $V_{GS}$ characteristics of the FET 40 at 0 volt and 1 volt on the TCT, showing a clear transition from E-Mode to D-Mode operation. The operation of the TCT is not discrete, or "digital", and so the TCT voltage can be continuously tuned to achieve the desired threshold voltage of the FET 40, be it strongly E-Mode, be it strongly D-Mode, or be it somewhere in-between, as dictated by the needs of the application circuit.

One issue with biasing a p-type region with a positive voltage is that such biasing would inject holes into the surrounding layers, either into the channel or into the substrate, causing parasitic drain current, noise, and back-gating by modulation of any interface trap charges. Referring to FIG. 4, the example FET 40 is fabricated in order to prevent hole injection from the p-doped layer 42, by surrounding the layer 42 on both sides by AlGaAs barriers as the middle barrier 50 and the back barrier 52. Even higher TCT voltages may be achieved by using a wide band-gap material such as AlAs on either side of the p-doped channel 48, which offers an even larger barrier, for example, up to about 2 eV, for holes to surmount if the holes are to cross over into the valence bands of adjacent layers. These "hole-blocking" layers 62, 66 shown in FIG. 4 on either side of the p-doped layer 42 would range in thickness from about 2 nm to about 20 nm.

Additional undoped spacers 64, 68 around the p-doped region, as shown in FIG. 4, may be used to further tailor the threshold voltage as a function of TCT voltage, and to provide etch-stops for easier fabrication of TCT contacts.

Figure 5A:
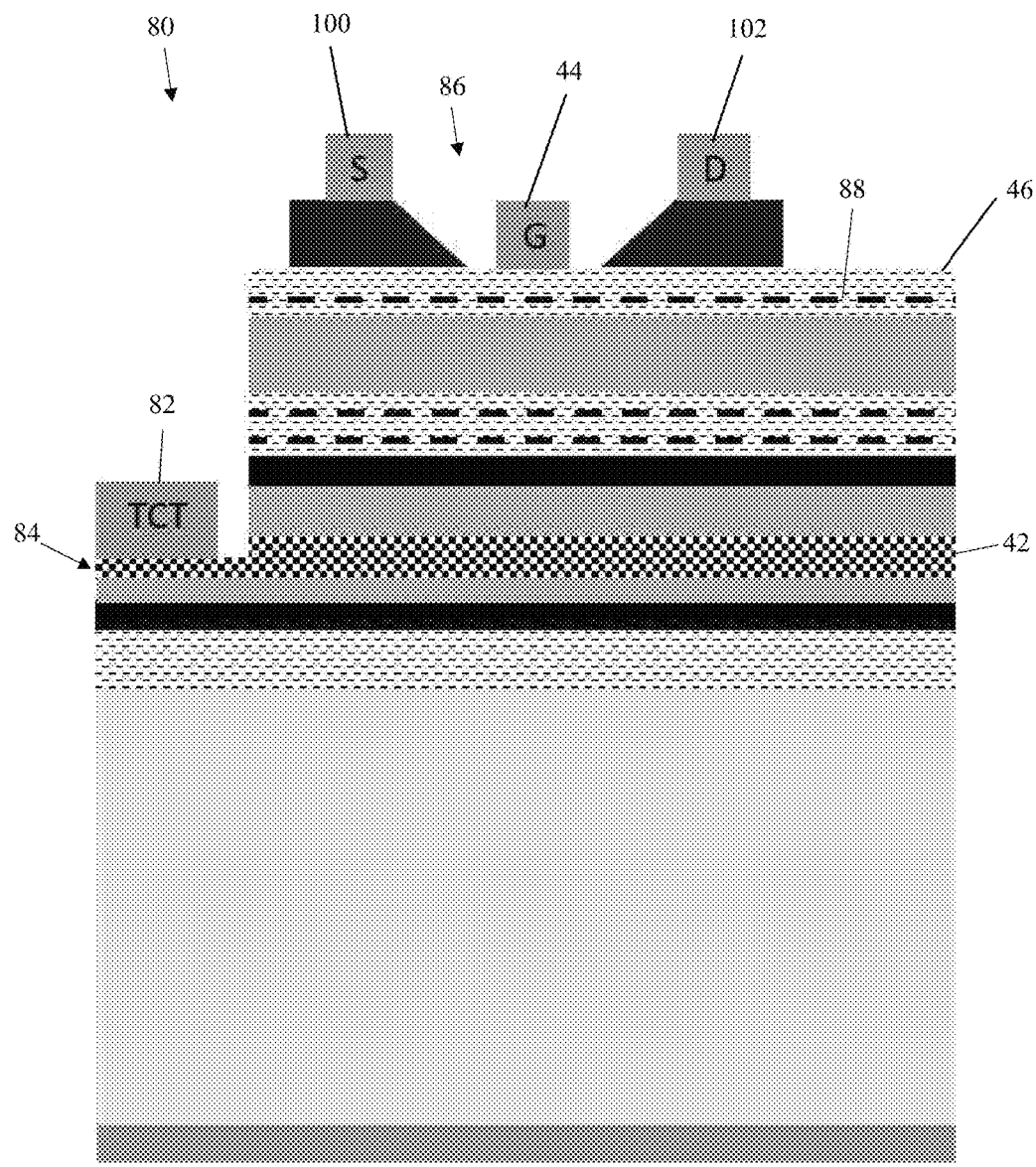
FIG. 5A illustrates an HEMT of the present invention with a mesa.
Figure 5B:
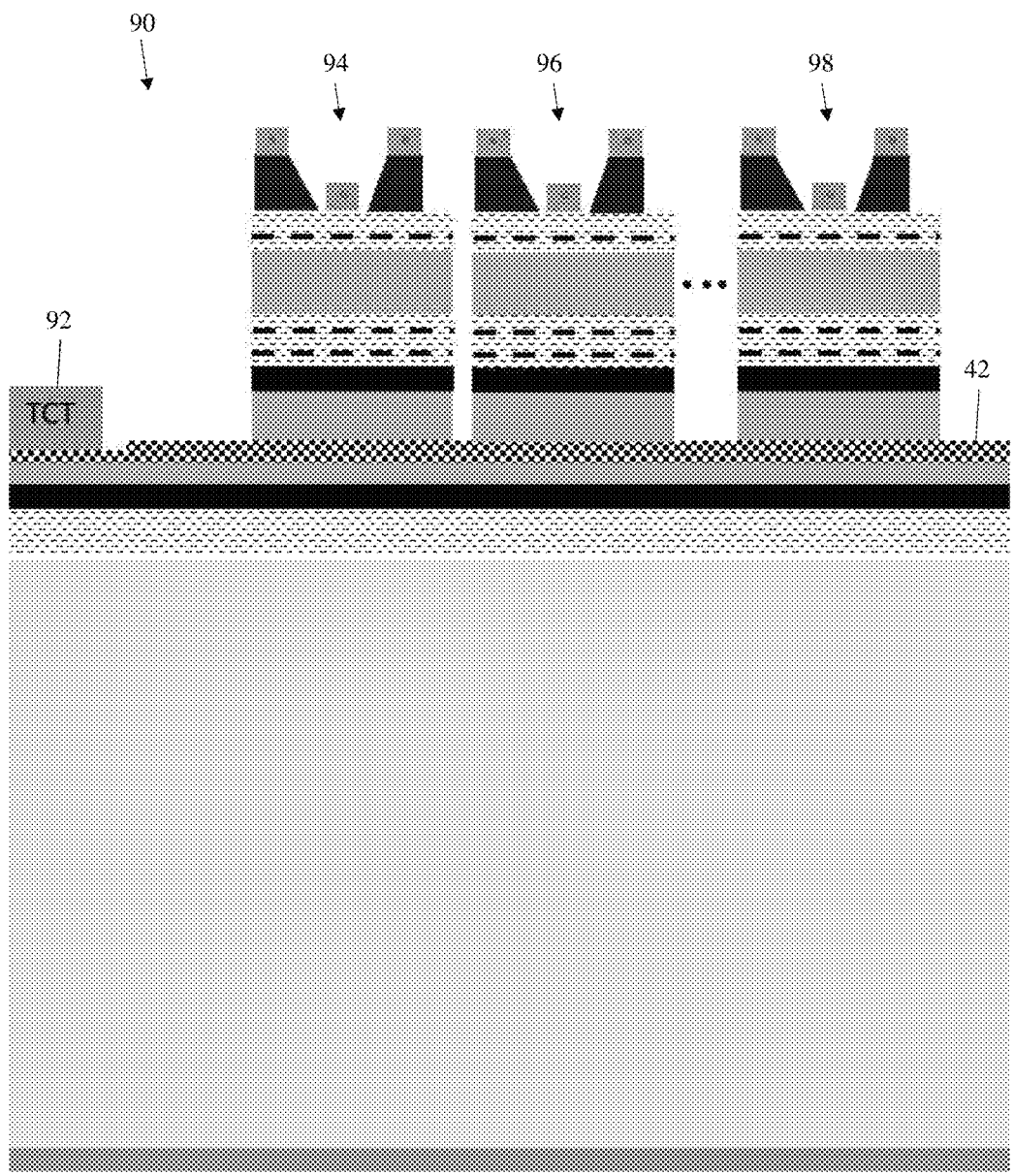
FIG. 5B illustrates a variant of the HEMT of FIG. 5A.

The present invention is also directed to a method of fabrication of a TCT-FET. FIGS. 5A-5B shows schematics of alternative devices 80, 90, respectively, fabricated based on the structure of FIG. 4, with the p-doped region 42 contacted by a metal to form TCT contacts 82, 92, respectively. Standard photolithography, wet or dry chemical etching, and/or metallization processes may be used to form these TCT contacts 82, 92. FIG. 5A illustrates a FET 80 which features a TCT contact 82 fabricated on a separate mesa 84 for each individual device 86. As described herein, an optional pulse doping layer 88 is disposed in a front barrier of the device 86. FIG. 5B illustrates a FET 90 which features a universal TCT contact 92 for all devices 94, 96, 98 combined.

With an appropriate choice of materials, dimensions and fabrication processes, the inventive devices 80, 90 in FIGS. 5A-5B, respectively, may be expected to yield a threshold voltage tunable between about −2 to about +2 volt, using about 0 to about +10 volt applied to the TCT contacts 82, 92, respectively.

In the preferred embodiment, the threshold voltage is tunable between a lower value ranging from about −0.5 to about −0.1 volt, and an upper value ranging from about +0.1 to about +0.7 volt, using about 0 to about +1 volt applied to the TCT contacts 82, 92. This would enable dual E/D Mode operation on a single FET with a single-polarity (positive-only) power supply.

In alternative embodiments, the present invention includes different flavors of FETs apart from HEMTs. In one alternative embodiment, counter-doped layers are disposed underneath the channel that modify the threshold voltage in hole-channel (p-channel) FETs when the carriers of electrical current are holes rather than electrons. The TCT access layer would then be n-doped.

In another alternative embodiment, doped TCT-access layers are disposed underneath the channel that enable tunability of the threshold voltage in FETs that deplete a doped channel, i.e. a pre-existing bridge between the source and drain, by applying a voltage opposite in polarity to the ionized impurities (dopants). These include Hetero-Junction FETs (HFET), a junction gate FET (JFET) and Metal-Semiconductor FETs (MESFETs).

Further alternative embodiments include FETs in which the various layers, including the p-doped layer, the spacers, the hole-blocking layers, the channel, the barriers are composed of (In)GaAs, (In)GaP, (Ga)AlAs, (Al)InAs, (In)GaN or (Ga)AlN compounds or alloy materials disposed on GaAs, InP, GaN, Si, SiC or $Al_2O_3$ substrates.

Other alternative embodiments may have a uniformly doped layer in the place of any pulse-doping layer, with the uniformly doped layer having the same polarity as the pulse-doping layer which is replaced. For example, if the front barrier 46 includes an n-doped pulse-doping layer, such an n-doped pulse-doping layer 60, then the pulse-doping layer 60 may be replaced with an n-doped uniformly doped layer.

In still further alternative embodiments, the present invention enables fabrication of a dual enhancement-mode/depletion-mode (E-Mode/D-Mode) high electron mobility transistor (HEMT) called a threshold control terminal HEMT (TCT-HEMT); reduces capacitance between the TCT electrode and the source and drain electrodes of a TCT-HEMT, since such a capacitance may be parasitic; and fabricates a TCT-HEMT capable of high-frequency operation.

FIGS. 4-5B show exemplary TCT-HEMT structures 80 with a doped TCT-access layer 42 underneath the channel 48 contacted by a metal to form the TCT 82. However, the presence of longitudinally-extending conductive layers 100, 102, shown in FIGS. 5A and 7A-7B, in the form of source and drain layers, respectively, parallel to and overlapping the TCT-access layer 42, may result in large capacitances that effectively short-circuit the source/drain layers 100, 102 to signal-ground at moderate frequencies. This severely limits the bandwidth of the TCT-HEMT 80, i.e. such large capacitances preclude the amplification of high-frequency signals. The present invention describes methods of fabricating HEMTs 80 which reduces such large capacitances, thus permitting high-frequency operation.

Figure 10:
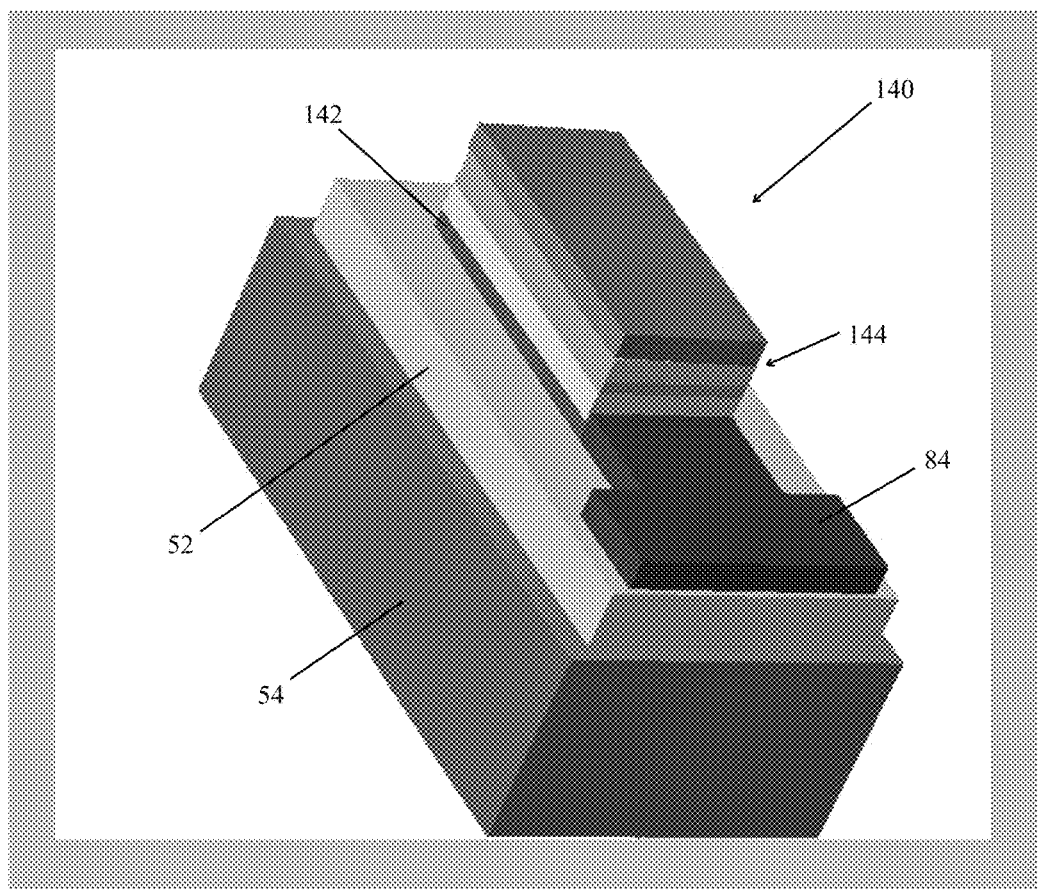
FIG. 10 illustrates a top perspective view of an intermediate step in fabrication of the present invention of FIG. 5A.

To reduce the source-TCT and drain-TCT capacitance of a TCT-HEMT from such longitudinally-extending layers 100, 102, the lateral extent of the TCT-access layer is reduced so that its overlap with the heavily doped source and drain access regions is minimized. As shown in FIG. 10, for the fabrication of TCT-HEMTs described herein, a base stack 140 is the starting point for all of the disclosed fabrication methods 200, 400 in FIGS. 13-14, respectively. As shown in steps 210, 410 of FIGS. 13-14, respectively, a base stack 140 in FIG. 10 is provided and/or formed, such that the base stack 140 has a back-barrier 52, which may optionally contain a hole-blocking layer deposited on a substrate 54 after any buffer layers necessary to assure clean growth are deposited and/or removed. An optional undoped spacer may be deposited on the back barrier 52.

Figure 13:
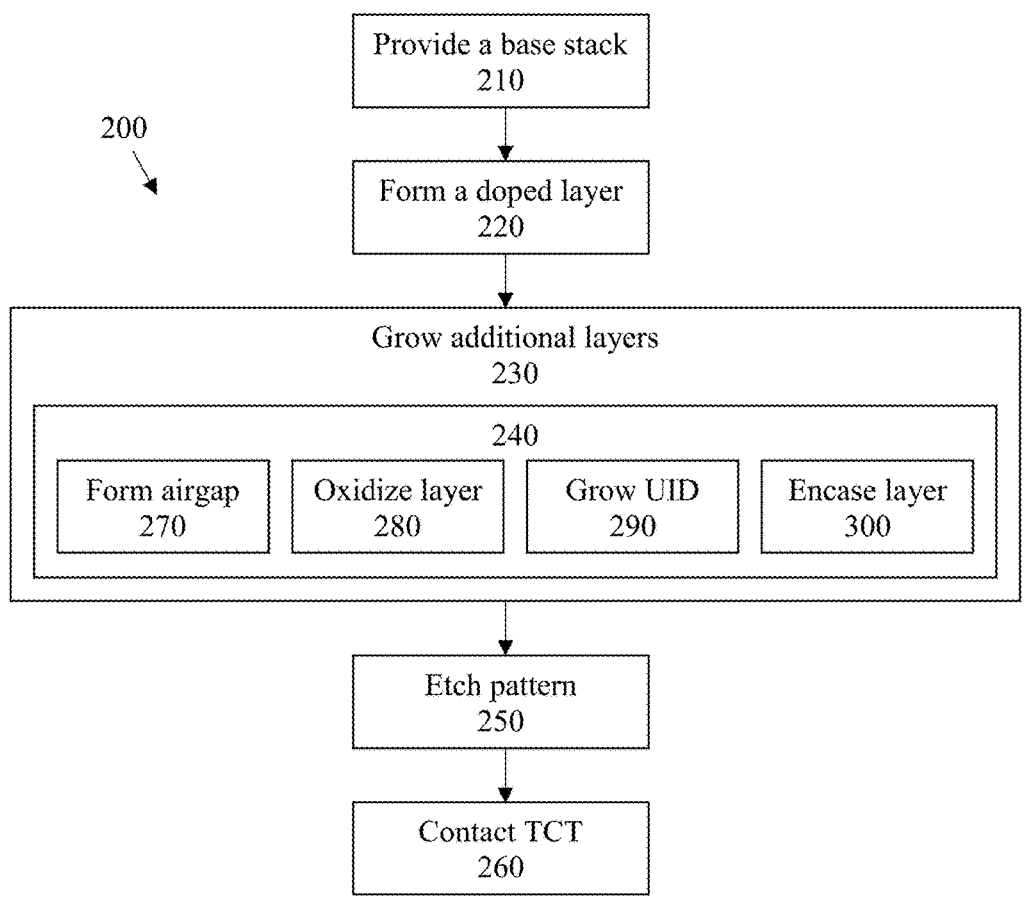
FIG. 13 is a flowchart of the fabrication method.

The general fabrication method 200 shown in FIG. 13 includes the steps of providing a base stack in step 210; forming a doped layer in step 220; growing additional layers in step 230 which includes performing at least one of the sub-steps 240; etching a pattern in step 250; and contacting the TCT 82 in step 260.

Figure 7A:
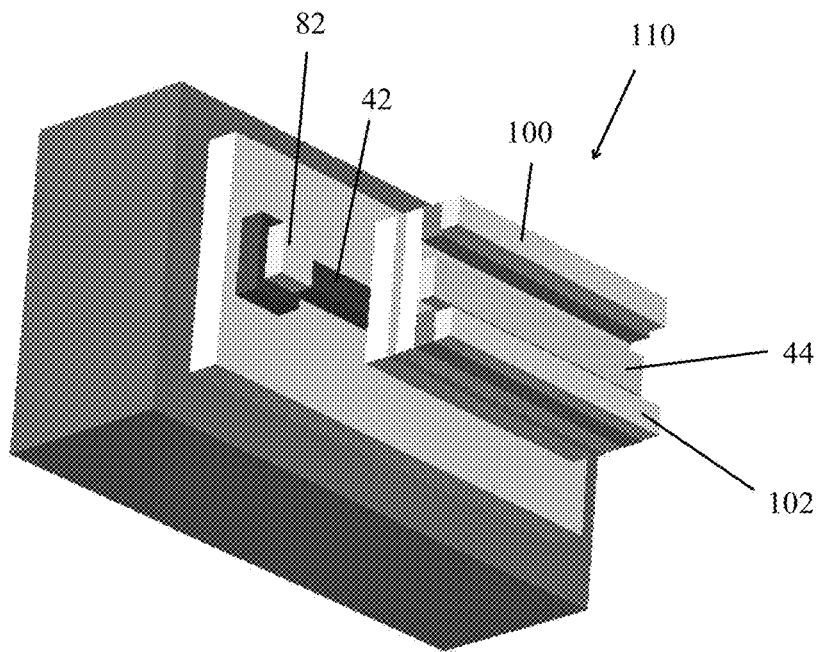
FIG. 7A illustrates a top perspective view of the present invention of FIG. 5A fabricated according to a first embodiment with an air gap.
Figure 7B:
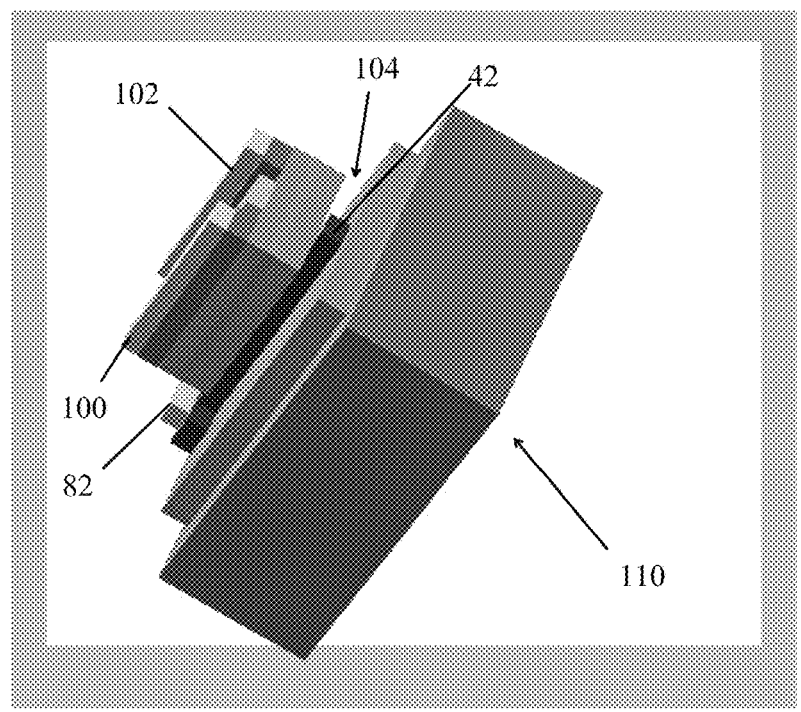
FIG. 7B illustrates a side perspective view of the present invention of FIG. 5A fabricated according to the first embodiment with an air gap.

In a first embodiment, FIGS. 7A-7B show two views of the inventive structure 110 fabricated according to the method 200 in FIG. 13, in which a space between the back barrier and the middle barrier contains a heavily doped, conducting region serving as the TCT access layer 42, which is substantially surrounded by an air gap 104, shown more clearly in FIG. 7B, and formed in step 270 of FIG. 13.

To fabricate the structure 110, a blanket doped layer 142, shown in FIG. 10, is deposited on the base stack 140 in step 220, followed by growth of the rest of the non-metallic layers 144 of the TCT-HEMT as shown in FIGS. 4 and 10, in step 230 of FIG. 13. A mesa 84 is formed for the HEMT by etching away all layers around the mesa 84 down to the doped layer 142 in step 250. The doped layer 142 is then patterned to form the long head with the mesa 84 for contacting by the TCT 82. The schematic structure at this stage is shown in FIG. 10. The top of the mesa 84 is processed by any of several known techniques in the prior art for HEMTs. The long head of the access region, which projects out of the mesa 84 in FIG. 10, is then contacted by the TCT 82, as shown in FIGS. 5A and 7A-7B, and performed in step 260.

If the doped layer 142 in FIG. 10 is thicker than about 100 nm, the doped layer 142 is susceptible to etching laterally using an appropriate wet chemical process. The fabricated structure is taken out of the etchant after the access layer 42 has reached the desired lateral dimensions. This technique has the advantage of not requiring any regrowth of the TCT-HEMT layers, i.e. all layers can be deposited in one step without removing the device from the chamber and exposing the intermediate layers to ultraviolet lithography and wet/dry chemical processing before returning to the growth chamber. The disadvantage is that mechanical stability is compromised by undercutting the access layer 42 underneath the source 100 and drain 102 to form the air-gap 104, thereby requiring relatively long access regions 42.

Figure 8:
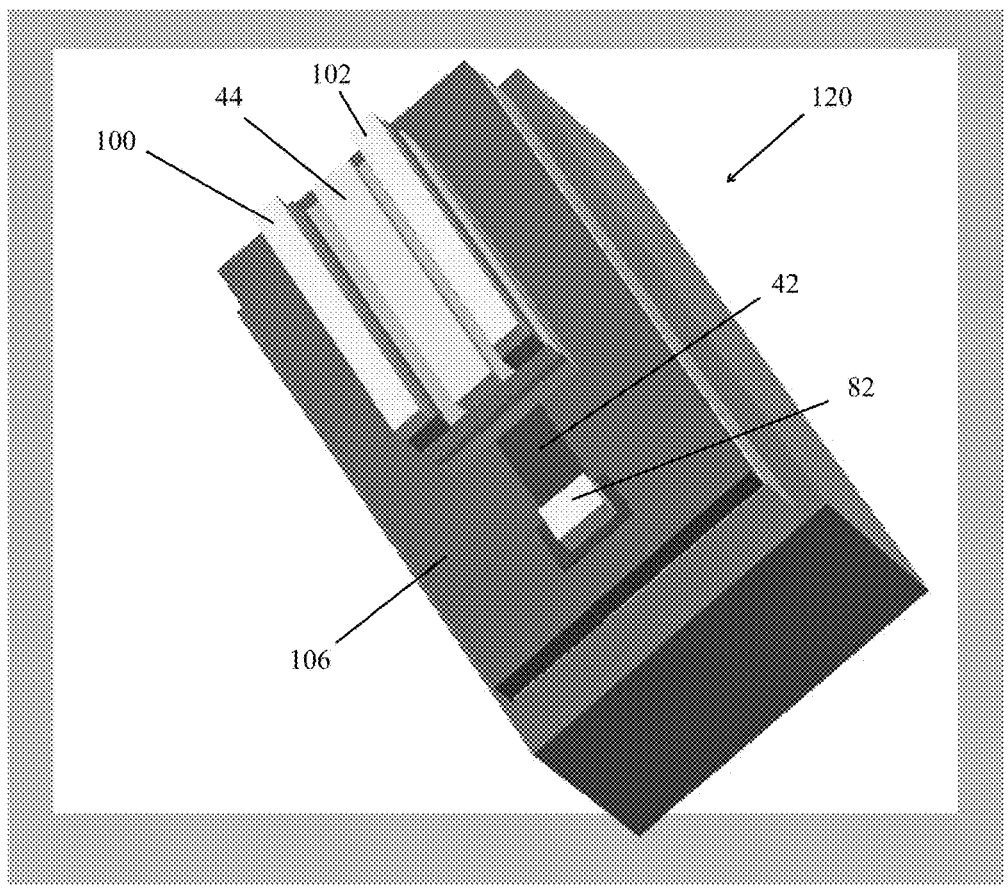
FIG. 8 illustrates a top perspective view of the present invention of FIG. 5A fabricated according to a second embodiment without an air gap.

In a second embodiment, the structure 120 shown in FIG. 8 has a layer 106, in which the air-gap 104 in FIGS. 7A-7B is replaced by the layer 106, to improve the mechanical stability of the structure 120. As shown in FIG. 8, the layer 106 is either composed of a non-conducting oxide formed in step 280 of FIG. 13, or composed of an unintentionally doped (UID) semiconductor formed in step 290 of FIG. 13.

For the embodiment in which the layer 106 is a non-conducting oxide formed in step 280, lateral oxidation is performed for certain materials. For example, if AlGaAs alloys are used to form the fabricated structure, then steam, for example, in the form of gaseous water, can be used to rapidly oxidize AlGaAs alloys of high aluminum content. Therefore, the doped layer may be an AlGaAs alloy more than about 100 nm thick and surrounded by GaAs spacers, to ensure that only the desired access layer is selectively oxidized from the sides, without oxidizing the thinner AlGaAs barriers as well. The oxidation step 280 may also be undertaken at an earlier stage; for example, after deposition of GaAs spacers and before growth of the front barrier 46, shown in FIGS. 4 and 5A.

Figure 11A:
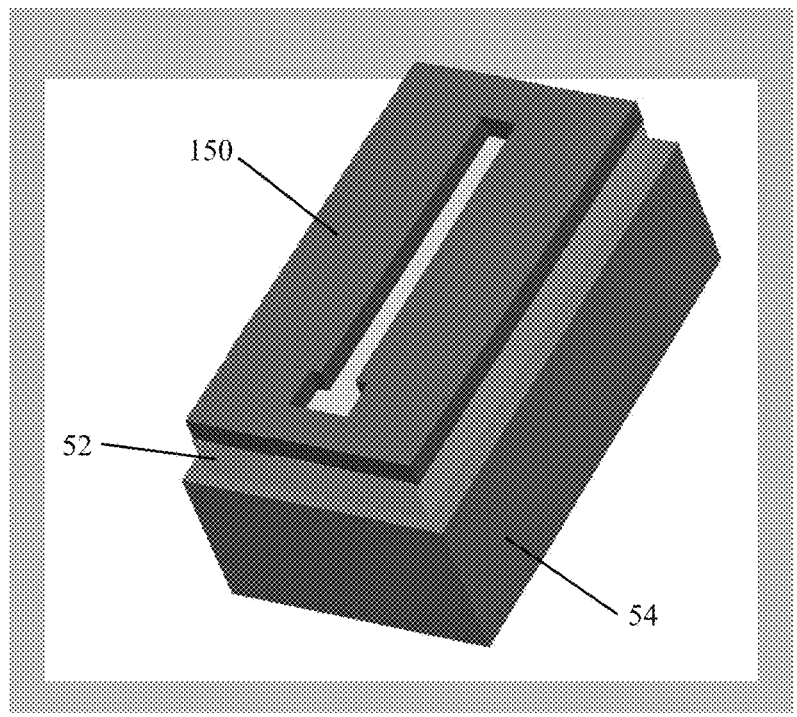
FIG. 11A illustrates a top perspective view of an intermediate step in fabrication of the second embodiment of the present invention.
Figure 11B:
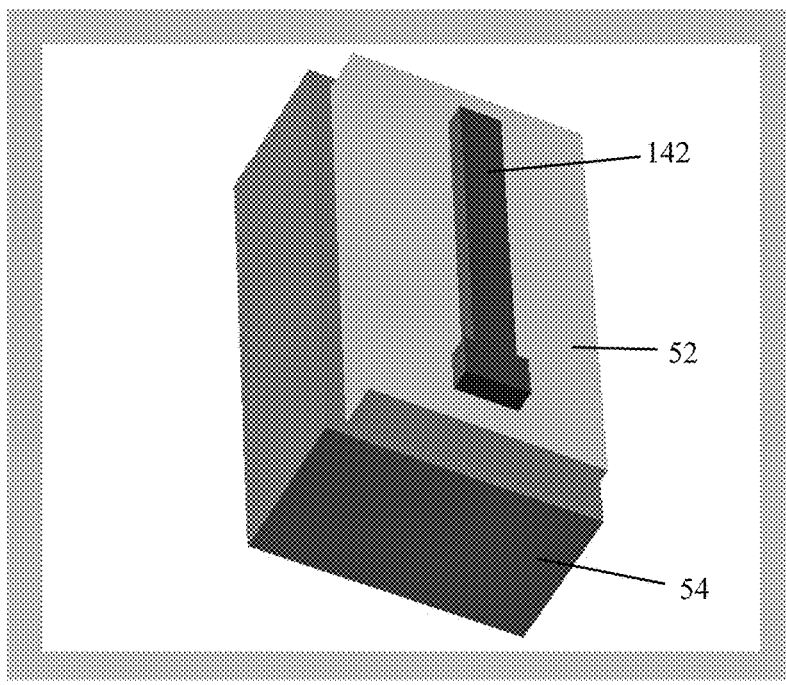
FIG. 11B illustrates a top perspective view of an alternative intermediate step in fabrication of the second embodiment of the present invention.

In an alternative to the second embodiment of the structure 120 shown in FIG. 8, the air-gap 104 in FIGS. 7A-7B is replaced by a layer 106 which is an unintentionally doped ("UID") semiconductor grown in step 290 in FIG. 13, and which surrounds most of the access layer 42, as shown in FIG. 8. To form the UID semiconductor, area-selective regrowth is performed, which is a known mechanism for fabricating mechanically robust structures. FIG. 11A shows a UID layer 150 deposited on the base stack, formed by the back barrier 52 on top of the substrate 54, and etched down wherever the doped access layer 142 is desired, as shown in FIG. 11B. The remaining UID surface is then selectively covered by a regrowth mask, such as SiO$_2$ deposited by plasma-enhanced chemical vapor deposition (PECVD). This is followed by growth of doped semiconductor to substantially the same height as the UID surface, so as to maintain a planar surface for subsequent growths. The growth is epitaxial; that is, with atoms arranged in an extended crystalline array forming an unbroken film only in the etched region, with no continuous growth on top of the regrowth mask. The regrowth mask may then be stripped, for example, using hydrofluoric acid, to yield the structure schematically shown in FIG. 12.

This is followed by growth of the rest of the non-metallic layers of the TCT-HEMT as shown in FIGS. 4 and 7A-7B, as in step 240 of FIG. 13. A mesa 84 is formed for the HEMT, as shown in FIGS. 5A and 7A-7B, by etching away all layers around the mesa down to the doped layer in step 250. The top of the mesa 84 is processed by any of several techniques known in the prior art for HEMTs. The doped layer is then contacted at the mesa 84 by the TCT 82 in step 260.

Figure 14:
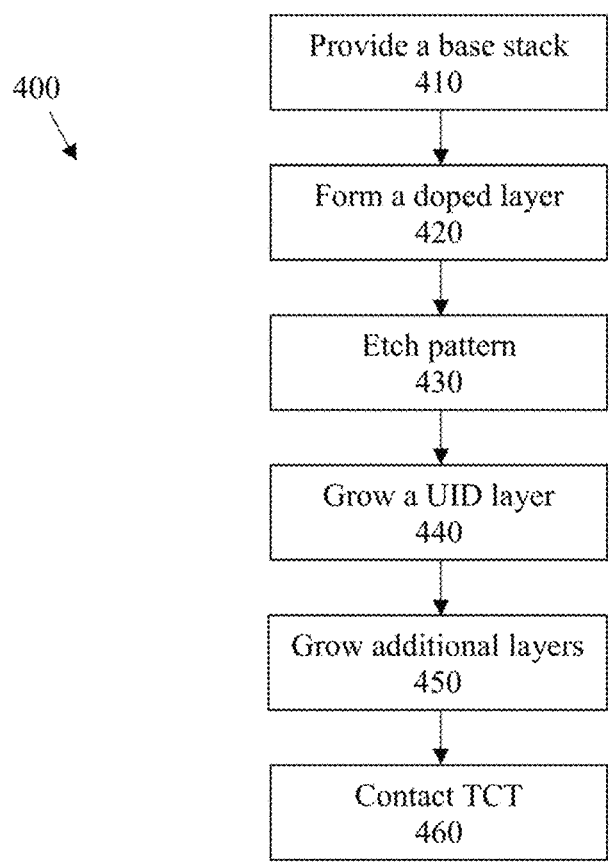
FIG. 14 is a flowchart of an alternative fabrication method.

A similar procedure in inverse is shown in FIG. 11B and performed by the method 400 in FIG. 14. After providing or forming a base stack in step 410, a doped layer 142 is deposited in step 420 and etched first in step 430, followed by area-selective regrowth of a UID semiconductor in step 440. This procedure may be preferable because it does not involve selective epitaxial growth within a small window, which is known to be difficult in practice. The remaining steps of growing additional layers of the HEMT in step 450 and contacting the TCT 82 in step 460 are then performed.

Figure 9:
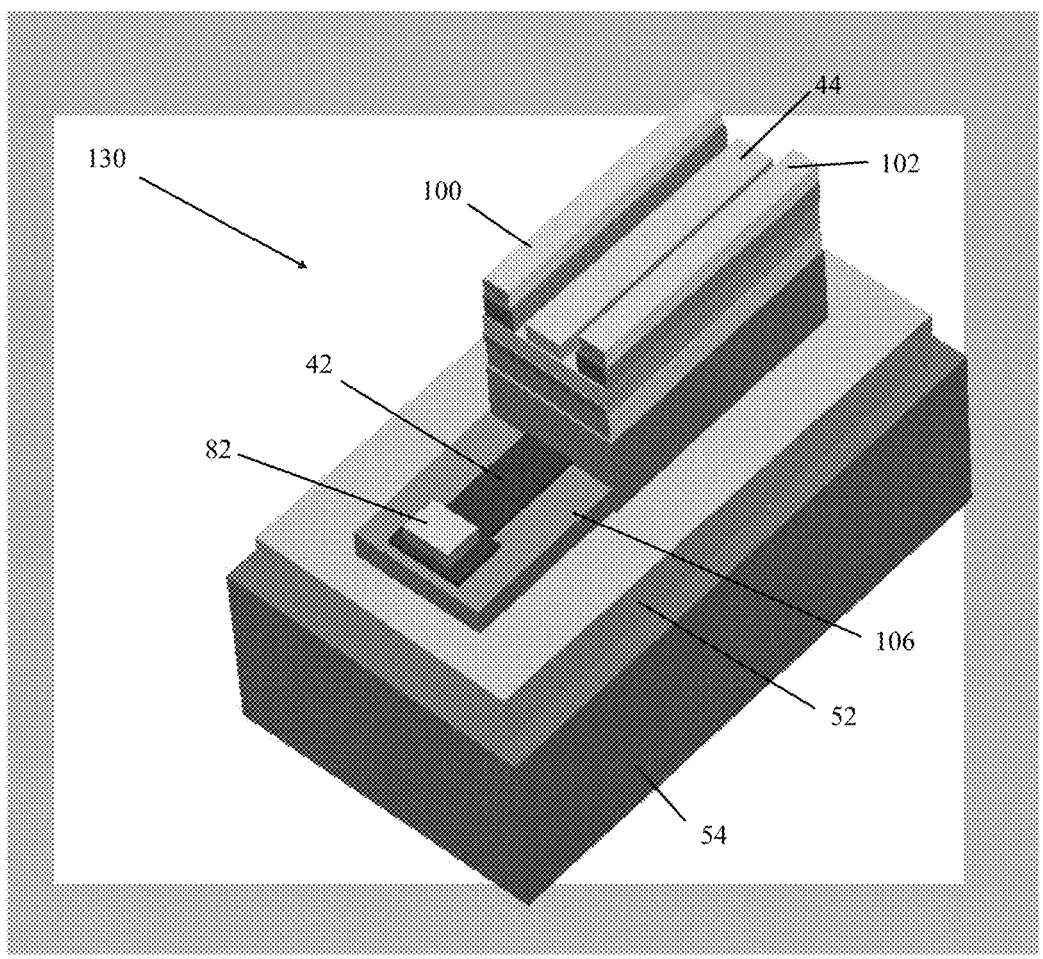
FIG. 9 illustrates a top perspective view of the present invention of FIG. 5A fabricated according to a third embodiment without an air gap.

In a third embodiment of the structure 130 shown in FIG. 9, and fabricated by the method 200 in FIG. 13, the doped access layer 42 is encased, in step 300, within the layer 106 which composed of an insulator or a UID semiconductor. The doped access layer 42 is completely encased except where the doped access layer 42 needs to be exposed in order to contact the access layer 42 with the TCT 82. FIG. 9 shows a variant of the second embodiment having a UID semiconductor in which, starting from the structure of FIG. 11B, instead of hard-mask deposition, a UID semiconductor is non-selectively deposited on the surface, covering both the doped region and the base stack formed by the back barrier 52 on top of the substrate 54. For depositions more than about 100 to about 200 nm thick, the planarity of the original surface is recovered. This enables growth and then processing of the rest of the layers. First, the remainder of the non-metallic layers of the TCT-HEMT are grown as shown in FIG. 4. A mesa 84 is formed for the HEMT by etching away all layers around the mesa 84, down to the doped layer 142. The top of the mesa 84 is processed by any of several techniques known in the prior art for HEMTs. The doped layer 142 is then contacted at the mesa 84 by the TCT 82.

Figure 12:
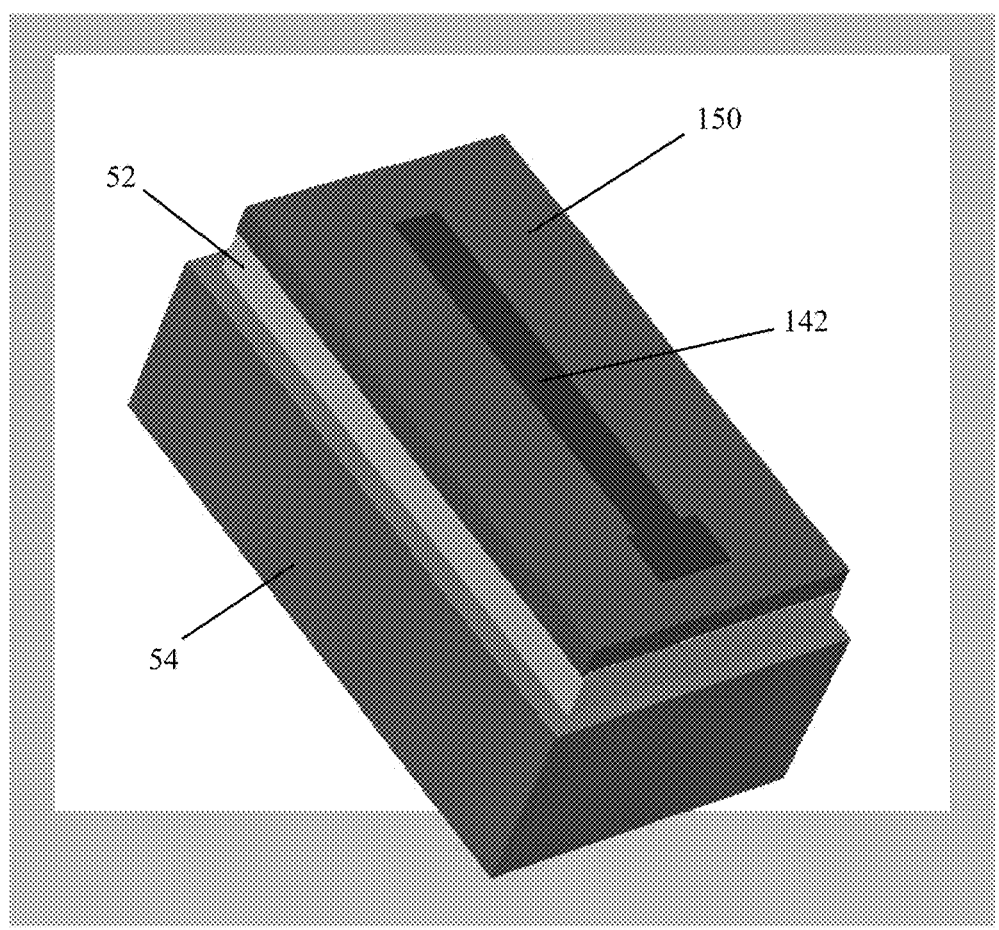
FIG. 12 illustrates a top perspective view of an intermediate step in fabrication according to a fourth embodiment of the present invention.

In a fourth embodiment, shown in FIG. 12, the doped semiconducting layer is not directly deposited during growth in step 220 of FIG. 13, but instead is formed from the undoped semiconductor with a separate doping process, for example, by ion implantation as step 220. In this embodiment, the UID semiconductor is substantially uniformly and substantially planarly deposited on the base stack, formed by the back barrier 52 deposited on the substrate 54. The area in which p-doping is desired is defined by photolithography. This area is exposed to dopant atoms by a process such as, for instance, ion-implantation. In this process, a beam of dopant ions of appropriate dose and energy, for example, boron ions for p-type doping, is applied so as to be implanted into the UID semiconductor. The dopants may optionally be activated by a thermal anneal, which results in the selected region of the semiconductor becoming p-type doped.

Growth of the rest of the non-metallic layers of the TCT-HEMT, as shown in FIG. 4, is then performed in step 240. A mesa 84 is formed for the HEMT by etching away all layers around the mesa 84 down to the doped layer 142 in step 250. The top of the mesa 84 is processed by any of several techniques known in the prior art for HEMTs. The doped layer 142 is then contacted at the mesa 84 by the TCT 82 in step 260.

The present invention may be embodied in other specific forms without departing from its spirit or essential characteristics. The described embodiments are to be considered in all respects only as illustrative and not restrictive. The scope of the invention, therefore, will be indicated by claims rather than by the foregoing description. All changes, which come within the meaning and range of equivalency of the claims, are to be embraced within their scope.

What is claimed is:

1. A method for fabricating a field-effect transistor (FET) comprising:
   providing a substrate;
   disposing a back barrier on the substrate to form a base stack;
   forming a doped layer on the base stack;
   grow additional layers, including a threshold-control terminal (TCT) access layer;
   etch a pattern in at least one of the doped layer and the additional layers; and
   disposing a TCT contact on the TCT access layer.

2. The method of claim 1, wherein the forming of the doped layer includes:
   depositing the doped layer on the base stack.

3. The method of claim 1, wherein the forming of the doped layer includes:
   forming a doped semiconducting layer from an undoped semiconductor layer.

4. The method of claim 3, wherein the forming of the doped semiconductor layer includes:
   performing ion implantation on the undoped semiconductor layer.

5. The method of claim 1, wherein the growing of additional layers includes:
   laterally etching the doped layer to form an air gap between at least two of the additional layers.

6. The method of claim 1, wherein the growing of additional layers includes:
   laterally oxidizing at least one of the additional layers to form an oxidized layer.

7. The method of claim 6, wherein the laterally oxidizing includes:
   applying steam to the at least one additional layer.

8. The method of claim 1, wherein the growing of additional layers includes:
   performing area-selective regrowth to at least one of the additional layers.

9. The method of claim 8, wherein the performing of the area-selective regrowth includes:
   depositing an unintentionally-doped (UID) layer on the base stack;
   applying a regrowth mask to the UID layer; and
   growing a doped semiconductor layer substantially to the height of a surface of the UID layer.

10. The method of claim 9, wherein the growing of the doped semiconductor layer is epitaxial.

11. The method of claim 9, wherein the applying of a regrowth mask includes:
    selectively depositing a masking layer by plasma-enhanced chemical vapor deposition (PECVD).

12. The method of claim 11, wherein the masking layer is composed of SiO2.

13. The method of claim 1, wherein the growing of the additional layers includes:
    growing a first additional layer on the base layer; and
    growing an unintentionally-doped (UID) layer on a surface of the doped layer and on a surface of the base stack.

14. The method of claim 1, wherein the growing of the additional layers includes:
    growing an unintentionally-doped (UID) layer on a surface of the base stack.

15. The method of claim 14, wherein the UID layer is grown substantially uniformly and substantially planarly on the base stack.

16. The method of claim 1, wherein the growing of additional layers includes:
    encasing a portion of the TCT access layer within an insulating layer.

17. The method of claim 1, wherein the growing of additional layers includes:
    encasing a portion of the TCT access layer within an unintentionally-doped (UID) layer.

18. A method for fabricating a field-effect transistor (FET) comprising:
    providing a substrate;
    disposing a back barrier on the substrate to form a base stack;
    forming a doped layer on the base stack;
    etch a pattern in the doped layer;
    grow an unintentionally-doped (UID) layer;
    grow an additional layer, including a threshold-control terminal (TCT) access layer; and
    disposing a TCT contact on the TCT access layer.

* * * * *